United States Patent [19]

Gascoyne

[11] Patent Number: 5,068,547
[45] Date of Patent: Nov. 26, 1991

[54] PROCESS MONITOR CIRCUIT

[75] Inventor: William H. Gascoyne, San Jose, Calif.

[73] Assignee: LSI Logic Corporation, Milpitas, Calif.

[21] Appl. No.: 577,945

[22] Filed: Sep. 5, 1990

[51] Int. Cl.$^5$ ..................... H03K 5/13; H03K 5/159
[52] U.S. Cl. ............................. 307/443; 307/242; 307/243; 307/572; 307/590; 307/591; 307/595; 307/600; 307/601; 364/490; 364/569; 324/73.1; 324/617; 324/621
[58] Field of Search ............... 324/73.1, 617, 621; 364/569, 490; 307/443, 242–243, 572, 590–591, 595, 601–602

[56] References Cited

U.S. PATENT DOCUMENTS

| 4,146,835 | 3/1979 | Chnapko et al. | 324/617 |
|---|---|---|---|
| 4,392,105 | 7/1983 | McLeod | 324/617 |
| 4,712,061 | 12/1987 | Lach | 324/617 |
| 4,845,390 | 7/1989 | Chan | 307/595 |
| 4,970,454 | 11/1990 | Stambaugh et al. | 324/73.1 |

Primary Examiner—Stanley D. Miller
Assistant Examiner—Margaret Rose Wambach
Attorney, Agent, or Firm—Skjerven, Morrill, MacPherson, Franklin & Friel

[57] ABSTRACT

In accordance with the present invention, a process monitor circuit and a method for monitoring a process are provided. The process monitor circuit provides first and second logic paths, the first logic path having a delay sensitive to whether the input logic transition is from logic high to logic low, or from logic low to logic high. The second logic path has substantially equal delays for either logic state transition. The two differences in delay between the first and second logic paths under the two logic state transitions are used to monitor the process steps for manufacturing the P and N transistors.

14 Claims, 6 Drawing Sheets

TRUTH TABLE

| A | E | S | N | Z |
|---|---|---|---|---|
| X | X | 0 | X | N |
| ↑ | 1 | 1 | X | ⊓ |
| ↓ | 1 | 1 | X | ⊓ |
| X | 0 | 1 | X | $\bar{A}$ |

WNWP
- PULSEWIDT = 2.3849E-07
- PULSE = 5.1710E-08
- DIR_D6LH = 2.4603-08

A/B = 4.612  A+2D = 287.696  NORMALIZED = -.020

NNNP
- PULSEWIDT = 1.3756E-07
- PULSEWIDT = 3.1229E-08
- DIR_D6LH = 1.4498E-08

A/B = 4.405  A+2D = 166.556  NORMALIZED = 0

SNSP
- PULSEWIDT = 8.7630E-08
- PULSEWIDT = 2.0485E-08
- DIR_D6LH = 8.9621E-09

A/B = 4.278  A+2D = 105.554  NORMALIZED = -.012

WNSP
- PULSEWIDT = 1.5322E-07
- PULSEWIDT = 4.0255E-08
- DIR_D6LH = 1.5416E-08

A/B = 3.806  A+2D = 184.052  NORMALIZED = -.632

SNWP
- PULSEWIDT = 1.9005E-07
- PULSEWIDT = 3.3005E-08
- DIR_D6LH = 2.0044E-08

A/B = 5.758  A+2D = 230.138  NORMALIZED = 1.234

NNWP
- PULSEWIDT = 2.0987E-07
- PULSEWIDT = 3.9296E-08
- DIR_D6LH = 2.1787E-08

A/B = 5.341  A+2D = 253.444  NORMALIZED = .773

WNNP
- PULSEWIDT = 1.8211E-07
- PULSEWIDT = 4.4454e-08
- DIR_D6LH = 1.8500E-08

A/B = 4.097  A+2D = 219.110  NORMALIZED = -.407

FIG. 6

PROCESS MONITOR CIRCUIT

BACKGROUND OF THE INVENTION

1. Field of the Invention

This invention relates to the process monitor circuits in integrated circuit (IC) fabrication, and in particular, process monitor circuits for monitoring PMOS and NMOS transistors in a CMOS process.

2. Description of the Prior Art

A semiconductor die on a wafer often includes not only the product to be manufactured, but also a number of process monitor circuits which are fabricated on the die at the same time. The process monitor circuits are tested and their performance serves as a parametric test of the integrity of the manufacturing process. A process monitor circuit connected to the input and output pins of the integrated circuit on the die is particularly convenient because the pins are readily accessible by the test equipment. Having the process monitor circuit connected to the input and output pins of the integrated circuit on the die also allows the circuit to be tested at various steps of the manufacturing process, such as wafer sort, final test, at the end user, or wherever correlation of reliability data with process parameters is valuable.

In the past, one process monitor circuit used a relatively long path of logic gates for monitoring the circuit speed attained. Definitionally, a long path means any signal path in which the time delay of the path primarily results from the propagation delay of the internal logic circuits, and the time delay is only negligibly contributed to by external factors, such as output capacitive load, or the rise and fall times of the input signals. As internal logic paths are often not accessible directly from the input pins of the integrated circuits, a test structure including a long delay circuit is specially built for the purpose of testing, and included in the circuit to be fabricated. This long delay circuit often takes the form of a chain of serially connected inverters. Typically, such a chain may contain 50–100 inverters.

Figure 1:
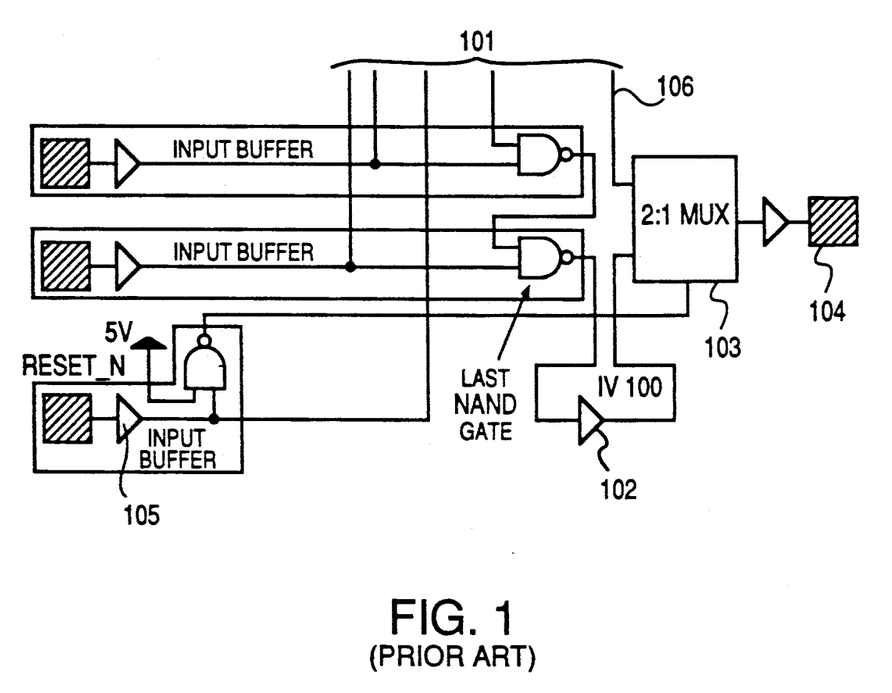
FIG. 1 shows a prior art process monitor circuit, including a chain of inverters.

FIG. 1 shows a process monitor circuit in the prior art. As shown, the process monitor circuit includes a test structure 101, called a NAND tree, for measuring input buffer voltage thresholds of logic states (VIH and VIL). The NAND tree 101 is a chain of two-input NAND gates, with each NAND gate's two input terminals connected respectively to the output terminal of an input buffer, and the output terminal of the previous NAND gate in the chain. The first NAND gate of the chain has one input terminal connected to the power supply, and the other input terminal connected to the first input buffer of the NAND tree 101. Under this arrangement, the NAND tree 101 allows testing of each input buffer by applying a voltage at the input associated with each input buffer, and examining the output voltage at the output terminal of the last NAND gate in the NAND tree 101.

In the circuit shown in FIG. 1, the output terminal of the last NAND gate in the NAND tree 101 is connected to the delay logic path 102, similar to the delay circuit discussed above, consisting of 100 serially connected inverters. The output of the delay logic path 102 is provided through 2:1 multiplexor 103 at an output pad 104. In this test circuit, input buffer threshold voltages and the circuit speed attained are measured, respectively, by examining the voltage and the delays of signal transitions at output pad 104. Both tests may be conducted using the same input and output pins because the threshold voltage (VIH and VIL) measurements are not sensitive to circuit speed, which is measured by the propagation delay through delay logic path 102. This circuit speed is only negligibly affected by the propagation at the NAND tree 101, the input buffer 105 and the multiplexor 103. The input buffer 105, connected to the input pin "reset", toggles between the "test" mode and the "normal operation" mode of the integrated circuit. The inverted output signal of input buffer 105 selects for output one of the input signals of multiplexor 103. During the test mode, the output signal of delay path 102 is selected as the output of multiplexor 103, and during normal operation mode, the output signal on lead 106, which is provided by the functional circuitry of the integrated circuit on the die, is selected as the output of multiplexor 103. Hence, in this arrangement, each input pin of the die is dual-purpose, i.e. used as an input pin during testing, and also used as an input or output pin during normal operation. The output pin, such as output pin 104, is also dual-purpose, serving as an output pin during testing and as an output pin during normal operation.

In CMOS circuits, the performance of the integrated circuit depends on the performance of both PMOS and NMOS transistors. Since the PMOS and NMOS transistors are formed at different stages of the manufacturing process, variations in process factor at a given step may not affect the PMOS and NMOS transistors equally. As will be explained in the detailed description of the present invention, the performance of the delay logic path 102 does not provide information indicative of the different impacts of process factors on PMOS and NMOS transistors.

Hence, it is desirable to have a process monitor circuit indicative of the relative performance of the NMOS and PMOS circuits.

SUMMARY OF THE INVENTION

In accordance with the present invention, a process monitor circuit is provided. This process monitor circuit includes a first delay path providing a first delay in response to logic high to logic low logic state transition signal at the input terminal of this first delay path, and providing a second delay when a logic low to logic high logic state transition signal is provided at the same input terminal. The process monitor circuit also includes a second delay path providing substantially equal delays for either logic state transition at the same input terminal. The difference between the delays of the first and second delay path for each logic state transition is indicative of the relative performance of the PMOS and NMOS transistors being monitored.

DETAILED DESCRIPTION

Figure 2:
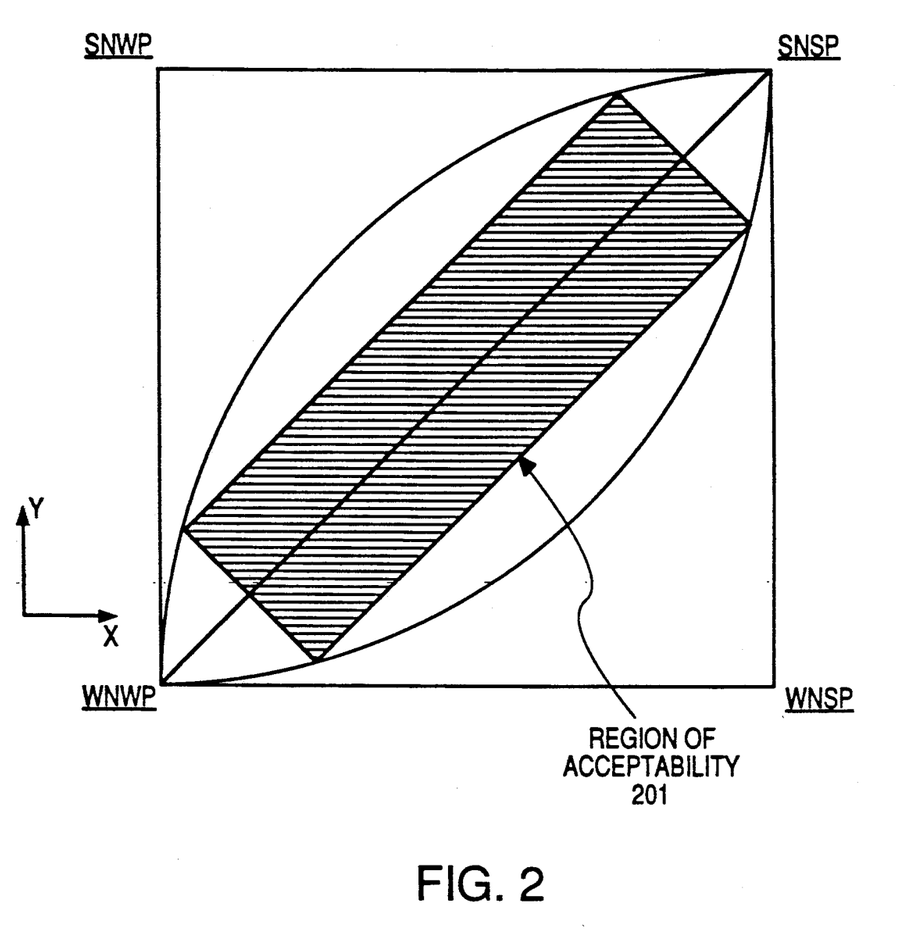
FIG. 2 shows a conceptual diagram of circuit performance with respect to four process corners.

FIG. 2 shows a conceptual diagram of circuit performance, with respect to four process "corners". Circuit performance may be measured by a number of parameters ("figures of merit"), for example, propagation delay with respect to a rising input signal. In FIG. 2, the increasing y direction represents the direction of change in circuit performance due to the variation in the process producing "stronger" NMOS transistors, and the increasing x direction represents the direction of change in circuit performance due to variation in the fabrication process producing "stronger" PMOS transistor. A stronger transistor may be defined as, for example, one with higher switching speed. As shown in the FIG. 2, the corner labelled "SNSP" represents the conceptual limit of circuit performance when the process is producing both strong NMOS and PMOS transistors. Likewise, "WNWP", "SNWP" and "WNSP" represent, respectively, conceptual limits of circuit performance when both PMOS and NMOS transistors are weak, the NMOS transistor is strong while the PMOS transistor is weak, or the NMOS transistor is weak while the PMOS transistor is strong. Typically, the various objectives of a manufacturing process are optimized when the circuit performance lies between these limits, such as within the shaded rectangle 201, called the "region of acceptability." Hence, quality control may be accomplished by a parametric test designed to reject any circuit having a measured performance which lies outside of the region of acceptability.

In the prior art, however, because the propagation delay in a chain of inverters is not sensitive to the relative strengths of the PMOS and NMOS transistors (i.e. since many combinations of PMOS transistor and NMOS transistor strengths can produce the same propagation delay), the propagation delay of a chain of inverters measures the "overall process factor", but is insufficient to determine, for example, if a circuit lies outside the region of acceptability because of a large discrepancy between the strengths of the PMOS and NMOS transistors. Hence, in order to fully determine if a circuit lies within the region of acceptances, the parametric test must include a measurement sensitive to the relative strengths of the PMOS and NMOS transistors.

The present invention takes advantage of the inherent higher speed of the NMOS transistor over the PMOS transistor of the same size. This speed difference is attributed to the higher mobility of electrons (the charge carriers in an NMOS transistor) over holes (the charge carriers in a PMOS transistor). This effect may be seen, for example, in a CMOS NOR gate. In such a NOR gate, a rising edge state transition is always slower than the same state transition in either a CMOS NAND gate or a CMOS inverter. This is because the NOR gate is typically formed by two or more PMOS transistors connected in series in the pull-up stage and an equal number of NMOS transistors connected in parallel to form the pull-down stage. In this configuration, the delay of the NOR gate in a rising edge transition is substantially the sum of the delays in the individual PMOS transistors. Furthermore, the delay of the NOR gate in a falling edge transition is substantially the delay of an NMOS transistor divided by the number of NMOS transistors, causing a large difference in delay between rising edge and falling edge transitions ("asymmetric transition property").

Figure 3:
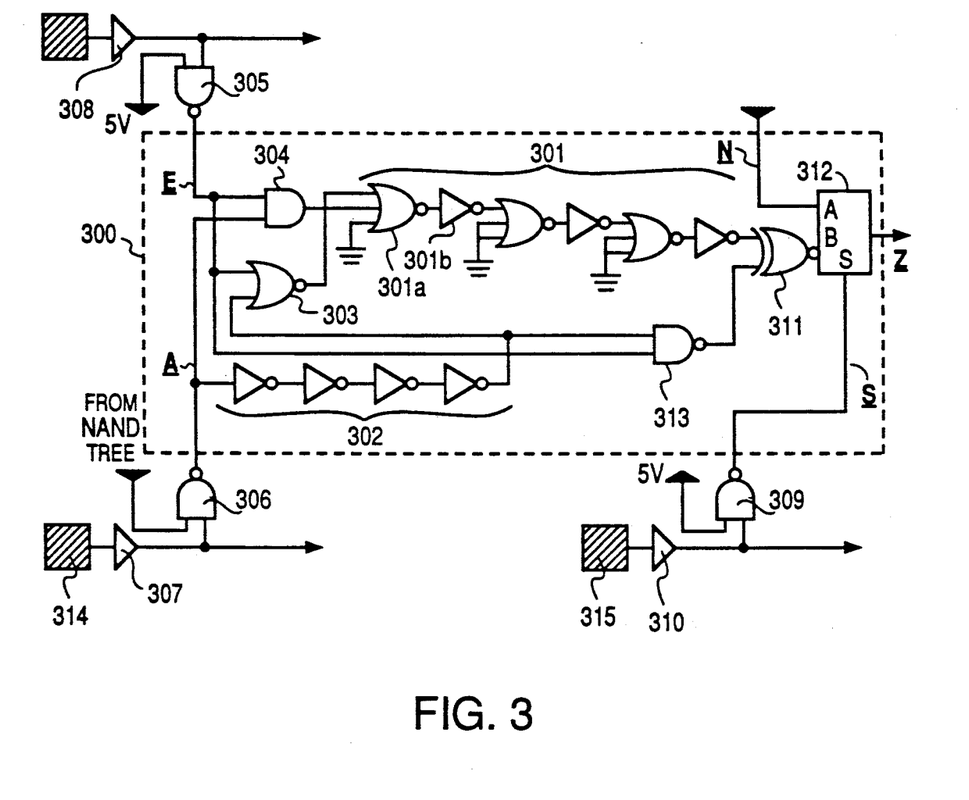
FIG. 3 shows an embodiment of the present invention, including both a chain of inverters and a chain of OR gates.
Figure 4A:
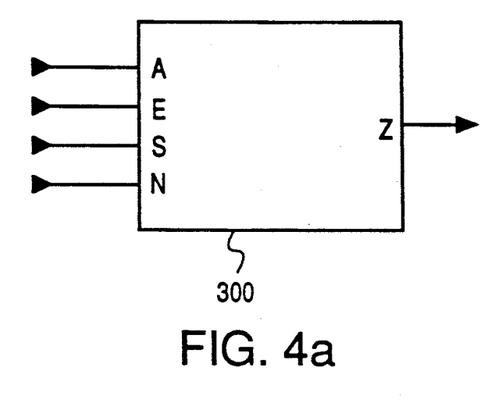
FIGS. 4a and 4b are a truth table relating the input signals A, E, S and N with the output signal Z in the embodiment shown in FIG. 3.
Figure 4B:
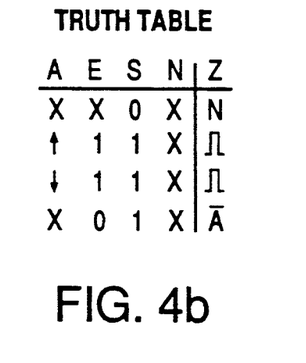

FIG. 3 shows the preferred embodiment of the present invention including test circuit 300. FIG. 4a is block diagram representation of test circuit 300 and FIG. 4b is the truth table relating the input signals A, E, S and N of test circuit 300 to its output signal Z. In this embodiment, the inverted output signal S of input buffer 310, i.e. output signal of NAND gate 309, selects whether test mode output signal at XNOR gate 311 or the output signal N of the functional integrated circuit is selected in the multiplexor 312 to generate output signal Z. The inverted output of input buffer 305, i.e. output signal of NAND gate 305, provides an enable signal E, which when ANDed at AND gate 304 with the test mode signal A enables a delay path 301.

Delay path 301 comprises a chain of OR gates, each of which is made up of a three-input NOR gate, such as NOR gate 301a, and an inverter, such as inverter 301b. Although only three OR gates are shown, the actual number of OR gates is much larger. The exact number of OR gates is not critical, but 50-100 OR gates will provide an appreciable delay difference between this delay path 301 and the second delay path 302 discussed below. In this embodiment, NOR gate 301a has the asymmetric transition property discussed above. Inverter 301b is designed such that the delays of its falling edge and rising edge transitions are roughly equal, so that, as a whole, the OR gate formed by NOR gate 301a and inverter 301b preserves the asymmetric transition property of the NOR gate 301a. The equal delays in the inverter 301b are accomplished by sizing the pull-up PMOS transistor twice as large as the pull-down NMOS transistor, taking into account the switching speed of an NMOS transistor is roughly twice that of a PMOS transistor of the same size. Specifically, in this embodiment, four PMOS transistors and two NMOS transistors, all of equal size, form respectively the pull-up and pull-down stages of each inverter.

As a signal is propagated through this delay path 301, the transition in each OR gate of the delay path 301 is of the same polarity, so that the asymmetric transition property of each NOR gate is magnified by the number of NOR gates in the delay path 301. The output signal of delay path 301 is provided as an input signal to XNOR (exclusive NOR) gate 311. It will of course be appreciated that the use of XNOR gate 311 is a matter of design choice, and the use of an XOR (exclusive-OR) gate is equally acceptable in practicing the present invention.

In the embodiment of the present invention of FIG. 3 a second delay path 302, comprising a number of inverters serially connected in a chain, is utilized. Unlike the inverters in delay path 301, these inverters are not required to have substantially symmetrical rising and falling edge transitions. Also, although only four inverters are shown in FIG. 3, many more are implemented to provide an appreciable delay between the input transition at pin 314 and the output of the delay path 314. Since, when a signal is propagated down the inverter chain 302, there are roughly the same number of rising edge transitions a there are falling edge transitions (exactly equal number of transitions when the number of inverter in delay path 302 is even), the propagation delay through the delay path 302 due to a rising edge transition is roughly equal to the propagation delay through the delay path 302 due to a falling edge transition. The output signal of the inverter chain 302 is provided as a input to AND gate 302 and NOR gate 303. When the enable signal E is at logic high, NAND gate 313 allows the output signal of inverter chain 302 to propagate as input to XNOR gate 311. However, when the enable signal E is at logic low, the output signal of inverter chain 302 propagates through NOR gate 303 and through the delay path 301.

Figure 5A:
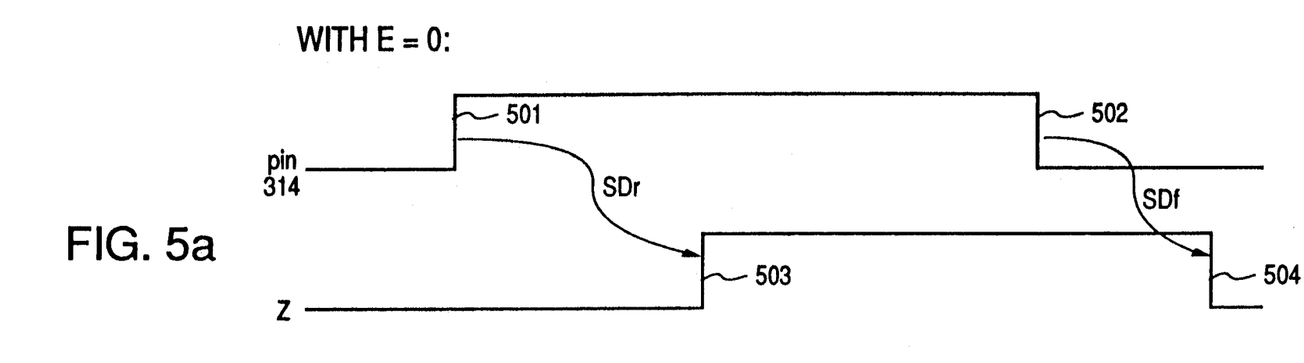
FIGS. 5a and 5b are timing diagrams of the logic transitions, under test mode, of the output signal Z in the embodiment of FIG. 3.

Under test mode (i.e. signal S at logic high), when the enable signal E is at logic low, the delay paths 301 and 302 together form a long delay path, which is logically an inverter in the implementation shown in FIG. 3. (See FIG. 4b). This delay path is an inverter only because of the even number of inverters implemented in this embodiment. Neither an even number nor an odd number of inverters is necessary to practice the present invention. The timing diagram in FIG. 5a shows, in the waveform labelled "pin 314", a rising edge transition 501 at the input pin 314 associated with the input buffer 307 (i.e. falling edge transition of signal A), followed by a falling edge transition 502 at the input pin 314. The transitions 503 and 504 of output signal Z, in the waveform labelled "Z", due to the transitions 501 and 502 of the input signal at the input pin 314, are respectively delayed by delay periods SDr and SDf as indicated in FIG. 5a. SDr is the delay between the rising edge transition 501 at input pin 314 and the output signal Z's transition 503. SDf is the delay between the falling edge transition 50 at the input pin 314 and the output signal Z's transition 504. The average of these delays ((SDr+SDf)/2) provides an indication of the overall process factor.

Alternatively, under test mode, when the enable signal E is at logic high, the delay paths 301 and 302 form two parallel delay paths with the respective output signal of each delay path provided as inputs to XNOR gate 311. In this embodiment shown in FIG. 3, the number of the OR gates in delay path 301 is much larger than the number of inverters in delay path 302, which ensures that the logic transition of output signal Z due to output transitions in the delay path 301 will always arrive later than the logic transition of output signal Z due to the output transitions in delay path 302. However, it is not required that the ratio of the number of OR gates (in path 301) to the number of inverters (in path 302) be as illustrated in FIG. 3. As shown in FIG. 4a, either a rising edge transition or a falling edge transition will cause a pulse of the same polarity at the output signal Z. The rising edge of each pulse represents the transition propagated through the delay path 302, which is the shorter delay path. The falling edge of each pulse is the transition propagated through the longer delay path 301.

Figure 5B:
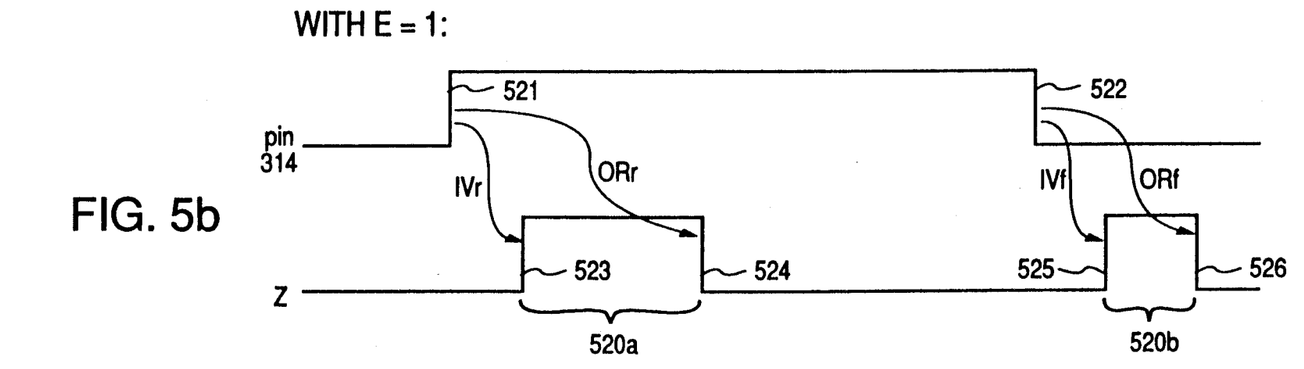

FIG. 5b shows a rising edge transitions 521 and a falling edge transition 522 of the input signal at the input pin 314. In response to this rising edge transition 521 and falling edge transition 522, pulses 520a and 520b, respectively, are produced. As explained above, rising edge 523 of pulse 520a, having a delay IVr, is due to the shorter delay path 302, and the falling edge 524 of pulse 520a, having a delay ORr, is due to the longer delay path 301. Likewise, for pulse 520b, the rising edge transition 525, having a delay IVf, and the falling edge transition 526, having a delay ORf, correspond respectively to the transitions propagated through delay paths 302 and 301. IVr is the delay between rising edge transition 521 at the input pin 314 and the transition 523 output signal Z, corresponding to propagation in the delay path 302. ORr is the delay between rising edge transition 521 at the input pin 314 and the transition 524 of output signal Z, corresponding to signal propagation in the delay path 301. IVf is the delay between falling edge transition 522 at the input pin 314 and the transition 525 of output signal Z, corresponding to signal propagation in the delay path 302. ORf is the delay between falling edge transition 522 at the input pin 314 and the transition 526 of the output signal Z, corresponding to signal propagation in the delay path 301.

Due to the asymmetric transition property of the NOR gates in the delay path 302, the pulses 520a and 520b are not of the same duration. Specifically, a stronger PMOS transistor will shorten the pulse 520a, and a stronger NMOS transistor will shorten pulse 520b. In particular, the ratio $((ORr-IVr)/(IVf-ORf))$ provides a parameter to measure the relative strengths of the PMOS and NMOS transistors. Alternatively, because the quantity (IVf-ORf) may be very small, e.g. as small as 4 ns, the ratio $((ORr-IVr)/IVr)$ is another parameter suitable for measuring the relative strengths of the PMOS and NMOS transistors.

By measuring at a single output terminal, the delay difference between two different delay paths caused by a transition at a single input terminal, rather than measuring the change in absolute delay in one path, an uncertainty due to variations in the actual arrival time of the input transition, e.g., transition 521 or transition 522 shown in FIG. 5b, is eliminated.

Figure 6:
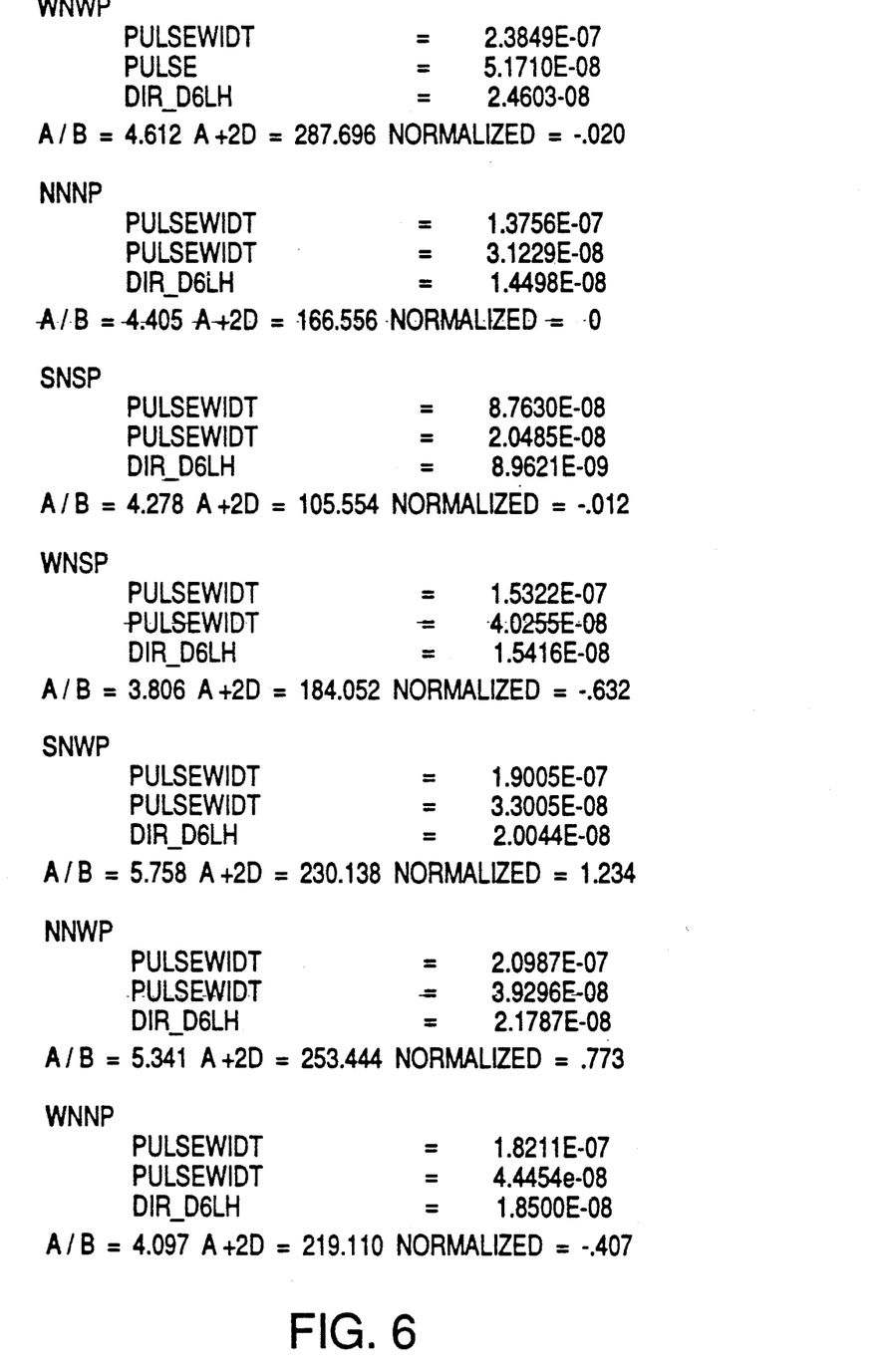
FIG. 6 is a table of the results from a simulation of the circuit shown is FIG. 3, under various process conditions.

FIG. 6 is a table of results from a simulation of the circuit shown in FIG. 3, under the seven process conditions: weak N - weak P (WNWP), and nominal N - nominal P (NNNP), strong N - strong P (SNSP), weak N - strong P (WNSP), strong N - weak P (SNWP), nominal N - weak P (NNWP) and weak N - nominal P (WNNP). Under each process condition, the first PULSEWIDT field corresponds to the pulse width A of pulse 520a, in response to the logic low to logic high transition at the input pin 314. The second PULSEWIDT field correspond to the pulse width B of pulse 520b, in response to logic high to logic low transition at input pin 314. The value D, labelled "D1R_D6LH", is the delay time between the input transition at input pin 314 and the rising edge of pulse 520a. This value D is used to compute a correction Factor CF, which is used to compute a normalized parameter "NORMALIZED" of the pulse widths of pulses 520a and 520b. The normalized parameter is given by:

$$NORMALIZED = A/B - CF. \qquad (1)$$

The correction factor CF is chosen such that the values of NORMALIZED for the process conditions WNWP, SNSP and NNNP are as close to zero as possible. For each process corner, CF is computed by $$CF = -(A + 2d - 166.556)/532.5 - 4.405 \qquad (2)$$

Where A+2D is the pulse width A plus two times the delay D; this sum roughly corresponds to the sum of delay paths 301 and 302. 166.556 is the total delay of these delay paths under process condition NNNP, while 4.405 is the ratio of A/B under the same NNNP process condition. The value 532.5 is chosen to minimize the magnitudes of NORMALIZED under WNWP and SNSP conditions. The value of the parameter NORMALIZED, as computed by equations (1) and (2), represents the relative strengths of the PMOS and NMOS transistors under the actual process condition.

In FIG. 6, the values A/B, A+2D and NORMALIZED are shown under each process corner simulated.

The above detailed description is intended to illustrate the specific embodiments of the present invention and not intended to be limiting. Persons of ordinary skill in the art will be able to make variations and modifications within the scope of the present invention, as defined by the following claims, after consideration of the above detailed description and the accompanying drawings.

I claim:

1. A process monitor circuit, comprising:
    a first delay path comprising a plurality of logic gates having an input terminal and a first output terminal, said first delay path providing after a first delay a first logic state transition at said first output terminal, when a first input logic state transition is received at said input terminal, and providing after a second delay a second logic state transition at said first output terminal, when a second input logic state transition opposite said first input logic state transition is received at said input terminal, said first and second delays being distinguishably different;
    a second delay path having a second output terminal and connected to said input terminal, said second delay path providing after a third delay a third logic state transition at said second output terminal, when said first input logic state transition is received at said input terminal, and providing after a fourth delay a fourth logic state transition at said second output terminal, when said second input logic state transition is received at said input terminal, said third and fourth delays being substantially equal; and
    means, having a third output terminal and connected to said first and second output terminals, for providing a logic state transition on said third output terminal upon receiving each of said first, second, third and fourth logic state transitions.

2. A process monitor circuit as in claim 1, wherein said means for providing a logic state transition comprises an XNOR logic gate.

3. A process monitor circuit as in claim 1, wherein said means for providing a logic state transition comprises an XOR logic gate.

4. A process monitor circuit as in claim 1, wherein said first delay path comprises a plurality of OR gates.

5. A process monitor circuit as in claim 1, wherein said second delay path comprises a plurality of inverters.

6. A process monitor circuit as in claim 1, wherein said first delay path comprises PMOS and NMOS transistors, and the difference between said first and second delays is substantially caused by a difference in switching times of said PMOS and NMOS transistors.

7. A process monitor circuit as in claim 4, wherein each of said plurality of OR gates comprises a NOR gate and an inverter.

8. A method for monitoring a process, comprising the steps of:
    using a first delay path comprising a plurality of logic gates having an input terminal and a first logic output terminal, said first delay path providing after a first delay a first logic transition at said first output terminal, when a first input logic state transition signal is received at said input terminal, and providing after a second delay a second logic state transition signal at said first output terminal, when a second logic state transition opposite said first input logic state transition is received at said input terminal, said first and second delays being distinguishably different;
    using a second delay path having a second output terminal and connected to said input terminal, said second delay path providing after a third delay a third logic state transition output signal at said second output terminal, when said first input logic state transition is received at said input terminal, and providing after a fourth delay a fourth logic state transition at said second output terminal, when said second input logic state transition is received at said input terminal, said third and fourth delays being substantially equal; and
    using means, having a third output terminal connected to said first and second output terminals, for providing a logic state transition upon receiving each of said first, second, third and fourth logic state transitions.

9. A method for monitoring a process as in claim 8, wherein said means for providing a logic state transition comprises an XNOR logic gate.

10. A method for monitoring a process as in claim 8, wherein said means for providing a logic state transition comprises an XOR logic gate.

11. A method for monitoring a process as in claim 8, wherein said first delay path comprises a plurality of OR gates.

12. A method for monitoring a process as in claim 8, wherein said second delay path comprises a plurality of inverters.

13. A method for monitoring a process as in claim 8, wherein said first delay means comprises PMOS and NMOS transistors, and said difference between said first and second delays is caused substantially by the difference in switching times of said PMOS and NMOS transistors.

14. A method for monitoring a process as in claim 11, wherein each of said plurality of OR gates comprises a NOR gate and an inverter.

* * * * *